United States Patent
Seo et al.

(10) Patent No.: US 9,941,338 B2
(45) Date of Patent: Apr. 10, 2018

(54) ORGANIC LIGHT-EMITTING DIODE DISPLAY AND METHOD OF MANUFACTURING THE SAME

(71) Applicant: Samsung Display Co., Ltd., Yongin-si, Gyeonggi-do (KR)

(72) Inventors: Il Hun Seo, Suwon-si (KR); Byoung Ki Kim, Seoul (KR); Hee Kyung Kim, Busan (KR); Young Jun Shin, Seongnam-si (KR); Yun-Mo Chung, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/958,798

(22) Filed: Dec. 3, 2015

(65) Prior Publication Data
US 2016/0211309 A1    Jul. 21, 2016

(30) Foreign Application Priority Data
Jan. 21, 2015    (KR) .......................... 10-2015-0010125

(51) Int. Cl.
*H01L 27/32*    (2006.01)
(52) U.S. Cl.
CPC ................. *H01L 27/3258* (2013.01)
(58) Field of Classification Search
None
See application file for complete search history.

(56) References Cited

U.S. PATENT DOCUMENTS

| 2014/0004704 A1 | 1/2014 | Hung et al. |
| 2014/0159002 A1* | 6/2014 | Lee ...................... H01L 27/3246 257/40 |
| 2017/0117340 A1* | 4/2017 | Park ...................... H01L 27/3246 |

FOREIGN PATENT DOCUMENTS

| KR | 10-2007-0019838 A | 2/2007 |
| KR | 10-2008-0000849 A | 1/2008 |
| KR | 10-2012-0004783 A | 1/2012 |

* cited by examiner

*Primary Examiner* — Fernando L Toledo
*Assistant Examiner* — Valerie N Newton
(74) *Attorney, Agent, or Firm* — Knobbe Martens Olson & Bear LLP

(57) ABSTRACT

An organic light-emitting diode display and a method of manufacturing the same are disclosed. In one aspect, the display includes a substrate including a display area configured to display an image and a peripheral area surrounding the display area. The display also includes a thin film transistor formed in the display area over the substrate, a first planarization layer covering the TFT in the display area, and an OLED formed over the first planarization layer and electrically connected to the TFT. The display also includes a second planarization layer formed in the peripheral area, the second planarization layer including a plurality of outgassing holes formed therein, and at least a portion of the second planarization layer thinner than the first planarization layer.

14 Claims, 5 Drawing Sheets

ORGANIC LIGHT-EMITTING DIODE DISPLAY AND METHOD OF MANUFACTURING THE SAME

CROSS-REFERENCE TO RELATED APPLICATION

This application claims priority to and the benefit of Korean Patent Application No. 10-2015-0010125 filed in the Korean Intellectual Property Office on Jan. 21, 2015, the entire contents of which are incorporated herein by reference.

BACKGROUND

Field

The described technology generally relates to an organic light-emitting diode display and a method of manufacturing the same.

Description of the Related Technology

Typical display devices include liquid crystal displays (LCDs), plasma display panels (PDPs), organic light-emitting diode (OLED) displays, field effect displays (FEDs), electrophoretic display devices (EPDs), and the like.

An OLED display includes two electrodes and an organic emission layer interposed therebetween. Electrons injected from one electrode and holes injected from the other electrode are bonded to each other in the organic emission layer to form excitons, and light is emitted while the excitons discharge energy.

Since an OLED display has self-luminance characteristics and does not require a separate light source, unlike a liquid crystal display, thickness and weight thereof can be reduced. Further, because an OLED display has favorable characteristics such as low power consumption, high luminance, and high refresh rate, OLED technology has come into vogue as a next generation display technology.

Generally, in OLED displays, an organic layer including the emission layer degrade due to residual gas in a planarization layer formed of an organic material, which results in a pixel contraction phenomenon.

SUMMARY OF CERTAIN INVENTIVE ASPECTS

One inventive aspect relates to an OLED display and a method of manufacturing the same, which induce effective out-gassing and simultaneously suppresses a pixel contraction phenomenon, thereby improving the reliability of products.

Another aspect is an OLED display, including: a substrate including a display area for displaying an image and a peripheral area neighboring the display area; a thin film transistor formed in the display area on the substrate; a first planarization layer covering the thin film transistor in the display area; an organic light emitting element formed on the first planarization layer to be connected to the thin film transistor; and a second planarization layer formed in the peripheral area, the second planarization layer having a plurality of out-gassing holes formed therein, wherein a thickness of the second planarization layer in at least a region of the peripheral area is smaller than that of the first planarization layer.

The plurality of out-gassing holes can be formed in the region of the peripheral area.

A width between a pair of adjacent out-gassing holes among the plurality of out-gassing holes can be 400 to 700 µm.

The OLED display can further include a plurality of wires formed in the peripheral area on the substrate, the plurality of wires being covered by the second planarization layer. Some of the plurality of wires can be positioned between the pair of out-gassing holes.

The thin film transistor can include: an active layer formed on the substrate; a gate electrode formed on the active layer; and source and drain electrodes positioned on the gate electrode, the source and drain electrodes being connected to the active layer. The first planarization layer can cover the source and drain electrodes, and the source and drain electrodes can be formed in the same layer as the plurality of wires.

The organic light emitting element can include: a first electrode formed on the first planarization layer to be connected to the drain electrode; a pixel defining layer formed over the first electrode to define a pixel area; an organic emission layer formed over the first electrode to contact the first electrode in the pixel area; and a second electrode formed on the organic emission layer.

The OLED display can further include an alignment mark formed in the peripheral area, the alignment mark being covered by the second planarization layer. The alignment mark can be positioned between the pair of out-gassing holes.

The thickness of the second planarization layer can be less than 5 µm.

The thickness of the first planarization layer can be 6 to 8 µm.

The first and second planarization layers can be formed in the same layer.

Another aspect is an OLED display, including: a substrate including a display area for displaying an image and a peripheral area neighboring the display area; an active layer formed in the display area on the substrate; a gate electrode formed on the active layer; an interlayer insulating layer formed over the gate electrode; source and drain electrodes positioned on the interlayer insulating layer, the source and drain electrodes being connected to the active layer; a first planarization layer covering the source and drain electrodes in the display area; an organic light emitting element formed on the first planarization layer to be connected to the drain electrode; an alignment mark covered by the interlayer insulating layer in the peripheral area; and a second planarization layer formed on the interlayer insulating layer in the peripheral area, wherein, in the second planarization layer, an exposure hole is formed to expose the interlayer insulating layer positioned over the alignment mark.

The alignment mark can be formed in the same layer as the gate electrode.

Another aspect is a method of manufacturing an OLED display, the method including: preparing a substrate including a display area for displaying an image and a peripheral area neighboring the display area; forming a thin film transistor in the display area on the substrate; forming a plurality of wires and alignment marks in the peripheral area; forming planarization layers respectively covering the thin film transistor and the plurality of wires and alignment marks in the display area and the peripheral area; and forming a plurality of out-gassing holes in the planarization layer in at least a region of the peripheral area, wherein the thickness of the planarization layer in the region is formed smaller than that of the planarization layer in the display area.

The thin film transistor can include: an active layer formed on the substrate; a gate electrode formed on the active layer; and source and drain electrodes positioned on the gate electrode, the source and drain electrodes being connected to the active layer. The first planarization layer can cover the source and drain electrodes, and the source and drain electrodes can be formed in the same layer as the plurality of wires and alignment marks.

The width between a pair of adjacent out-gassing holes among the plurality of out-gassing holes can be 400 to 700 µm.

The process of forming the thicknesses of the planarization layers to be different from each other can be performed using a halftone mask.

Some of the plurality of wires can be positioned between the pair of out-gassing holes.

The alignment mark can be positioned between the pair of out-gassing holes.

Another aspect is an organic light-emitting diode (OLED) display, comprising: a substrate comprising a display area configured to display an image and a peripheral area surrounding the display area; a thin film transistor (TFT) formed in the display area over the substrate; a first planarization layer covering the TFT in the display area; an OLED formed over the first planarization layer and electrically connected to the TFT; and a second planarization layer formed in the peripheral area, wherein the second planarization layer includes a plurality of out-gassing holes formed therein, wherein the second planarization layer is thinner than the first planarization layer.

In the above display, the second planarization layer is formed only in the peripheral area.

In the above display, the width between a pair of adjacent ones of the out-gassing holes is in the range of about 400 µm to about 700 µm.

The above display further comprises a plurality of wires formed in the peripheral area over the substrate, wherein the second planarization layer covers the wires, and wherein at least one of the wires is positioned between the pair of adjacent out-gassing holes.

In the above display, the TFT comprises: an active layer formed over the substrate; a gate electrode formed over the active layer; and source and drain electrodes formed over the gate electrode and electrically connected to the active layer, wherein the first planarization layer covers the source and drain electrodes, and wherein the source and drain electrodes are formed on the same layer as the wires.

In the above display, the OLED comprises: a first electrode formed over the first planarization layer and electrically connected to the drain electrode; a pixel defining layer formed over the first electrode so as to define a pixel area; an organic emission layer formed over the first electrode and contacting the first electrode in the pixel area; and a second electrode formed over the organic emission layer.

The above display further comprises an alignment mark formed in the peripheral area, wherein the alignment mark is covered by the second planarization layer, and wherein the alignment mark is positioned between the pair of adjacent out-gassing holes.

In the above display, the width between the pair is greater than the thickness of the second planarization layer and the thickness of the first planarization layer.

In the above display, the width between the pair is greater than the widths of the out-gassing holes.

In the above display, the thickness of the second planarization layer is less than about 5 µm.

In the above display, the thickness of the first planarization layer is in the range of about 6 µm to about 8 µm.

In the above display, the first and second planarization layers are formed on the same layer.

Another aspect is an organic light-emitting diode (OLED) display, comprising: a substrate comprising a display area configured to display an image and a peripheral area surrounding the display area; an active layer formed in the display area; a gate electrode formed over the active layer; an interlayer insulating layer formed over the gate electrode; source and drain electrodes formed over the interlayer insulating layer and electrically connected to the active layer; a first planarization layer covering the source and drain electrodes in the display area; an OLED formed over the first planarization layer and electrically connected to the drain electrode; an alignment mark covered by the interlayer insulating layer in the peripheral area; and a second planarization layer formed over the interlayer insulating layer in the peripheral area, wherein an exposure hole is formed in the second planarization layer so as to expose the interlayer insulating layer formed over the alignment mark.

In the above display, the alignment mark is formed on the same layer as the gate electrode.

Another aspect is a method of manufacturing an organic light-emitting diode (OLED) display, the method comprising: preparing a substrate comprising a display area configured to display an image and a peripheral area surrounding the display area; forming a thin film transistor (TFT) in the display area over the substrate; forming a plurality of wires and alignment marks in the peripheral area; forming a planarization layer in the display area and the peripheral area to cover the TFT, wires and alignment marks; and forming a plurality of out-gassing holes in the planarization layer formed in the peripheral area, wherein the thickness of the planarization layer formed in the peripheral area is less than that of the planarization layer formed in the display area.

In the above method, the TFT comprises: an active layer formed over the substrate; a gate electrode formed over the active layer; and source and drain electrodes formed over the gate electrode and electrically connected to the active layer, wherein the planarization layer covers the source and drain electrodes, and wherein the source and drain electrodes are formed on the same layer as the wires and alignment marks.

In the above method, the width between a pair of adjacent ones of the out-gassing holes is in the range of about 400 µm to about 700 µm.

In the above method, at least one of the wires is positioned between the pair of out-gassing holes.

In the above method, at least one of the alignment marks is positioned between the pair of out-gassing holes.

In the above method, the planarization layer is formed via a halftone mask.

According to at least one of the disclosed embodiments, effective out-gassing is induced and a pixel contraction phenomenon is suppressed, thereby improving reliability of products.

DETAILED DESCRIPTION OF CERTAIN INVENTIVE EMBODIMENTS

Figure 1:
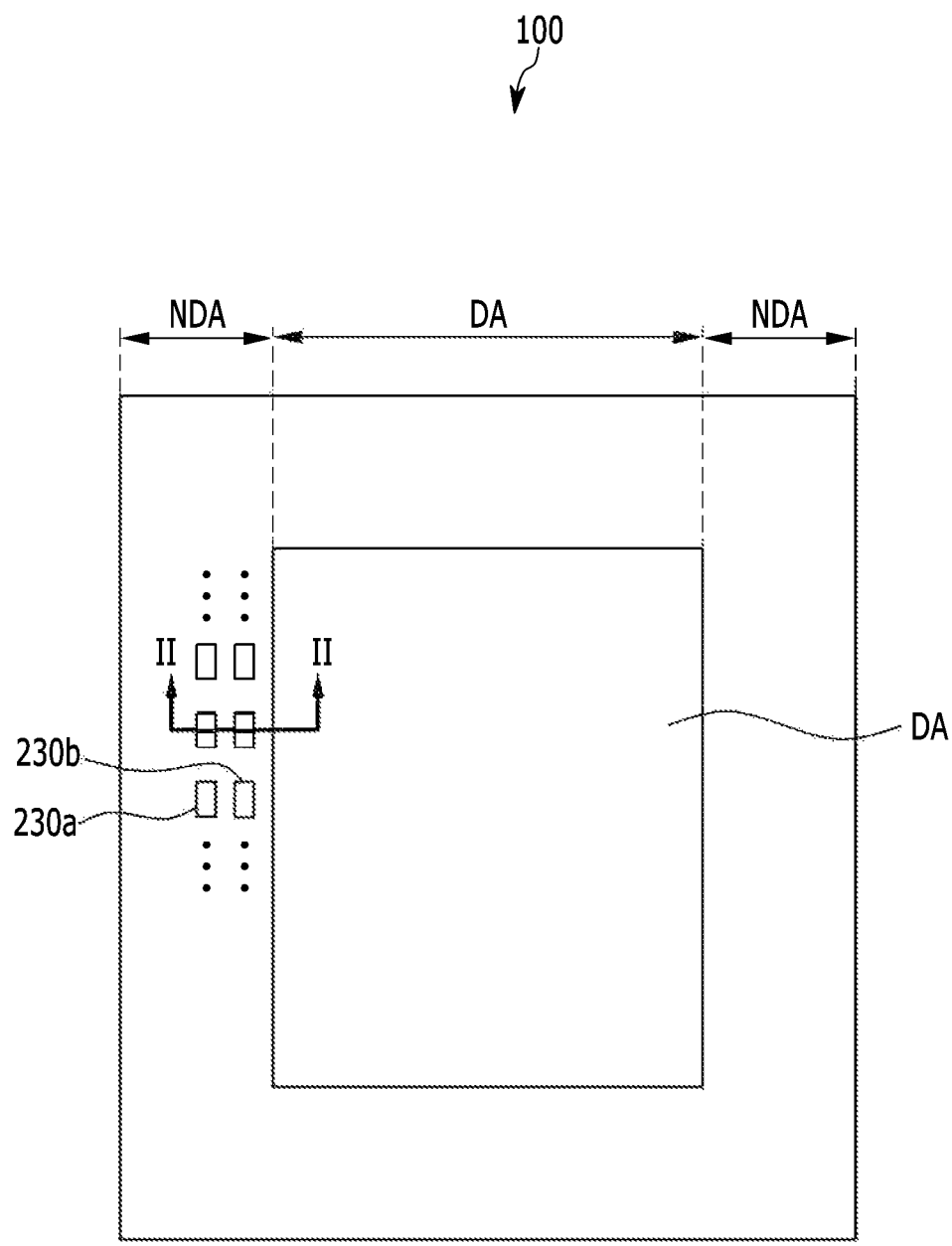
FIG. 1 is a top plan view schematically showing a structure of an OLED display according to a first exemplary embodiment.

Exemplary embodiments will now be described in detail with reference to the accompanying drawings. The described technology should not be construed as limited to the exemplary embodiments set forth herein, and can be modified in various different ways. Rather, these exemplary embodiments are provided so that this disclosure will be thorough and complete, and will fully convey the scope of the described technology to a person of ordinary skill in the art.

In the drawings, the thickness of layers, films, panels, regions, etc., are exaggerated for clarity. It will be understood that when a layer is referred to as being "on" another layer or a substrate, it can be directly on the other layer or the substrate, or a third layer can be interposed therebetween. Like reference numerals designate like constituent elements throughout the specification.

Hereinafter, an OLED display according to a first exemplary embodiment will be described with reference to FIGS. 1 to 3. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIG. 1 is a top plan view schematically showing a structure of an OLED display according to a first exemplary embodiment of the present invention. FIG. 2 is a schematic cross-sectional view of the OLED display according to the first exemplary embodiment taken along line II-II of FIG. 1. FIG. 3 is a layout view showing one pixel of the OLED display.

Figure 2:
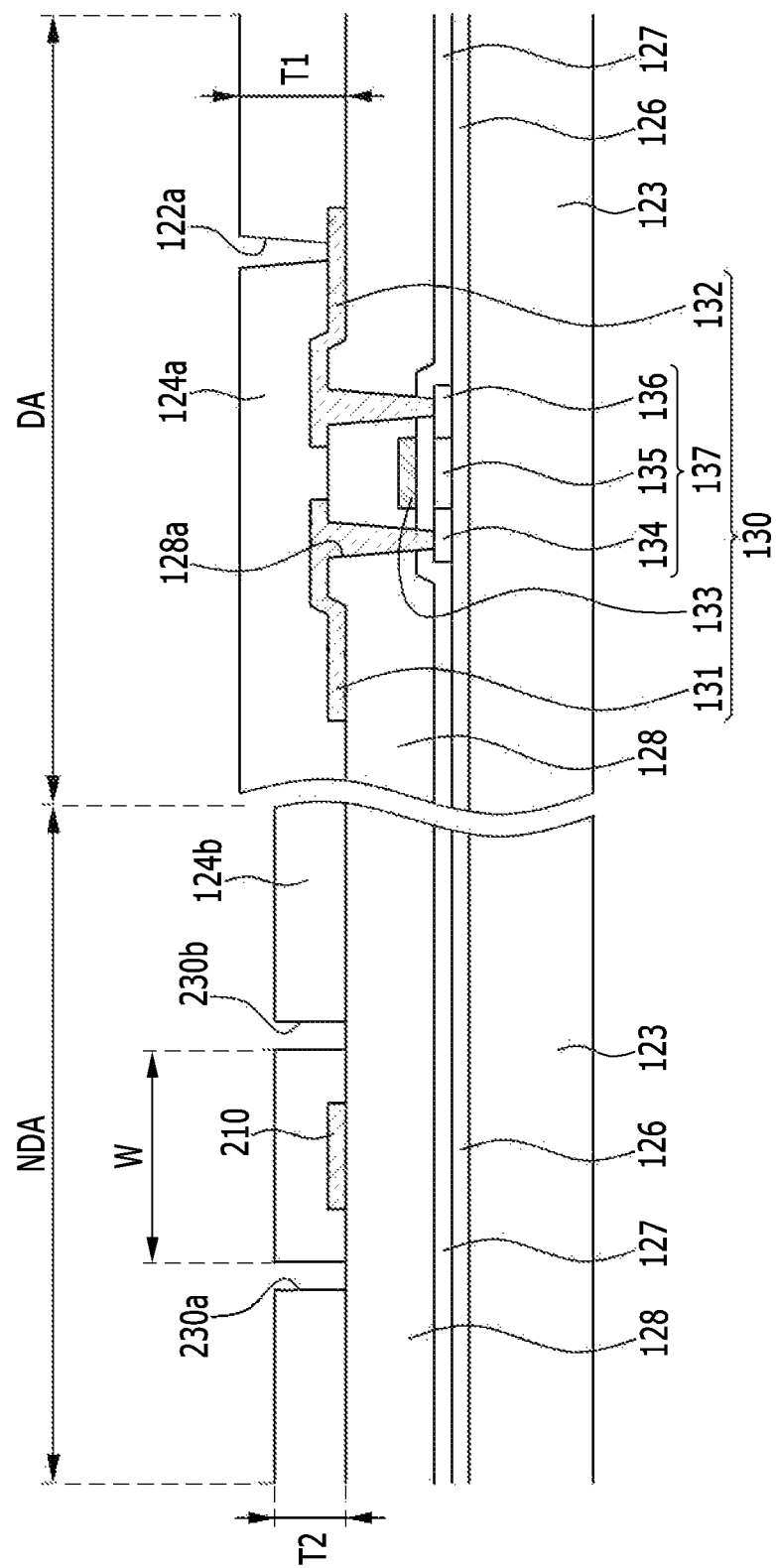
FIG. 2 is a schematic cross-sectional view of the OLED display according to the first exemplary embodiment taken along line II-II of FIG. 1.

Referring to FIGS. 1 and 2, in the OLED display 100, the thickness of a planarization layer in a peripheral area, in which an out-gassing hole is formed, is formed less than the thickness of a planarization in a display area.

In the OLED display according to the first embodiment, a substrate 123 includes a display area (DA) for displaying an image and a peripheral area (non-display area, NDA) neighboring the display area DA.

The display area DA can include OLEDs, thin film transistors (TFTs) for driving the OLEDs, and a plurality of wires connected to the OLEDs and the TFTS. The peripheral area NDA can include the wires extending from the display area DA, a pad part or pad portion in which pad electrodes are formed, an alignment mark that can be used in a process of manufacturing a display device, and the like. The components formed in the display area and the peripheral area will be described later.

Referring to FIG. 2, the substrate 123 is formed as an insulating substrate formed of glass, quartz, ceramic, plastic, or the like.

A buffer layer 126 is formed on the substrate 123. The buffer layer 126 performs functions of preventing permeation of impurities and planarizing a surface thereof. The buffer layer 126 can be formed of various materials for performing the functions. For example, the buffer layer 126 includes any one of a silicon nitride (SiNx) layer, a silicon oxide (SiOx) layer, and a silicon oxynitride (SiOxNy) layer. However, the buffer layer 126 is not always necessary, and can be omitted according to a type and process conditions of the substrate 123.

A driving semiconductor layer 137 is formed on the buffer layer 126. The driving semiconductor layer 137 is formed as a polysilicon layer. In addition, the driving semiconductor layer 137 includes a channel region 135 in which impurities are not doped, and source and drain regions 134 and 136 that are respectively doped at both sides of the channel region 135. In some embodiments, a doped ion material is a P-type impurity such as boron (B), and $B_2H_6$ is generally used as the doped ion material. The impurity changes depending on the type of the FTF. Although a driving transistor including the driving semiconductor layer 137 is described herein, the described technology is not limited thereto, and a switching transistor can also be formed on the buffer layer 126.

A gate insulating layer 127 formed of a silicon nitride (SiNx) or a silicon oxide (SiOx) is formed over the driving semiconductor layer 137.

A gate line including a driving gate electrode 133 is formed on the gate insulating layer 127. The driving gate electrode 133 is formed to overlap at least a portion of the driving semiconductor layer 137, particularly the channel region 135.

Meanwhile, an interlayer insulating layer 128 covering the driving gate electrode 133 is formed on the gate insulating layer 127. Contact holes 128a respectively exposing the source and drain regions 134 and 136 are formed in the gate insulating layer 127 and the interlayer insulating layer 128.

Like the gate insulating layer 127, the interlayer insulating layer 128 can be formed of a ceramic-based material such as a silicon nitride (SiNx) or a silicon oxide (SiOx).

A data line including a driving source electrode 131 and a driving drain electrode 132 is formed on the interlayer insulating layer 128. The driving source electrode 131 and the driving drain electrode 132 are connected to the source region 134 and the drain region 136 through the contact holes 128a respectively formed in the interlayer insulating layer 128 and the gate insulating layer 127.

As such, the driving semiconductor layer 137, the driving gate electrode 133, the driving source electrode 131, and the driving drain electrode 132 form a driving TFT 130. The configuration of the driving TFT 130 is not limited thereto, and can be changed in various ways to a known configuration that will be readily understood by a technologist in the TFT field.

According to the first exemplary embodiment of the described technology, the TFTs are formed on the display area DA of the substrate 123.

A planarization layer 124 covering the data line is formed on the interlayer insulating layer 128. The planarization layer removes a step difference and performs planarization in order to increase the emission efficiency of an OLED to be formed thereon.

Here, the described technology is not limited to the above-described structure, and either one of the planarization layer 124 and the interlayer insulating layer 128 can be omitted when desired.

The planarization layer can be formed of at least one of polyacrylate resin, epoxy resin, phenolic resin, polyamide resin, polyimide resin, unsaturated polyester resin, polyphenylene ether resin, polyphenylene sulfide resin, and benzocyclobutene (BCB).

According to the first exemplary embodiment, the planarization layer 124 can be divided into a first planarization layer 124a positioned in the display area DA and a second planarization layer 124b positioned in the peripheral area NDA.

Thus, the first planarization layer 124a can cover the driving source electrode 131 and the driving drain electrode 132. The first planarization layer 124a has an electrode via hole 122a exposing a portion of the drain electrode 132.

Meanwhile, in the peripheral area NDA, a plurality of wires or alignment marks 210 can be formed on the interlayer insulating layer 128. Reference numeral 210 shown in FIG. 2 designates the wires or alignment marks.

The wires or alignment marks 210 can be formed on the same layer as the data line in the display area DA. That is, the wires or alignment marks 210 can be formed of the same material as the data line.

In some embodiments, the wires 210 are signal lines extending from the display area DA, which will be described later, and the alignment marks 210 are alignment marks used to align masks in a process of manufacturing a display device.

In the peripheral area NDA, the second planarization layer 124b is formed to cover the wires or alignment marks 210. A plurality of out-gassing holes 230a and 230b can be formed in the second planarization layer 124b. The out-gassing holes are formed in the second planarization layer 124b to discharge residual gas in the planarization layer formed as an organic layer to the outside. However, the out-gassing holes can be formed in the first planarization layer 124a in the display area DA, as well as the second planarization layer 124b.

In some embodiments, the wires or alignment marks 210 can be formed between the out-gassing holes. As shown in FIG. 2, the wires or alignment marks 210 are formed between adjacent out-gassing holes 230a and 230b.

Meanwhile, according to the first exemplary embodiment, the thickness T2 of the second planarization layer 124b in a region where the out-gassing holes 230a and 230b are formed can be formed less than the thickness T1 of the first planarization layer 124a in the display area DA. The region in which the out-gassing holes 230a and 230b are formed represents a region in which the width W between the out-gassing holes 230a and 230b is formed within a substantially constant range. Here, the width W between the out-gassing holes 230a and 230b can be in the range of about 400 μm to about 700 μm. However, depending on the embodiments, the width W can be less than about 400 μm or greater than about 700 μm.

When the adjacent out-gassing holes 230a and 230b exist in the range of the width W, the amount of residual gas in the second planarization layer 124b in the region where the out-gassing holes are formed increases as compared with those in other regions. The residual gas degrades an organic emission layer, which can result in a pixel contraction phenomenon. Thus, in order to prevent the organic emission layer from being degraded by the residual gas, the thickness T2 of the second planarization layer 124b in the region is formed less than the thickness T1 of the first planarization layer 124a.

In some embodiments, the thickness T2 of the second planarization layer 124b is less than about 5 μm. The thickness T1 of the first planarization layer 124a can be in the range of about 6 μm to about 8 μm. However, depending on the embodiments, the thickness T2 can be greater than about 5 μm and the thickness T1 can be less than about 6 μm or greater than about 8 μm.

Figure 3:
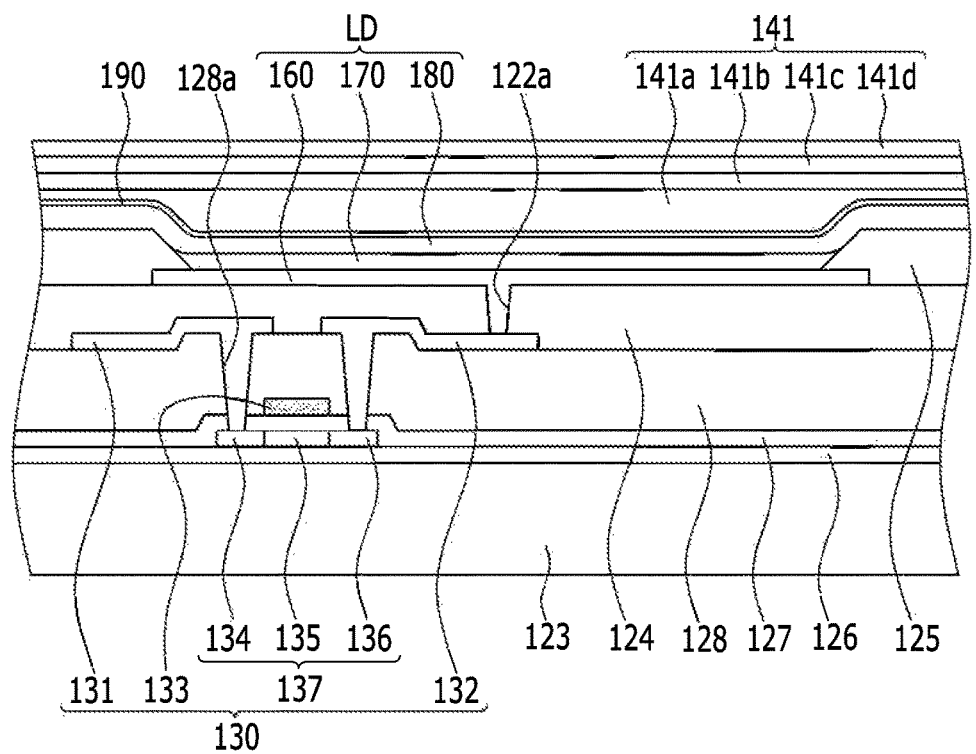
FIG. 3 is a layout view showing one pixel of the OLED display.

Referring to FIG. 3, a first electrode, i.e., a pixel electrode 160, is formed on the first planarization layer 124a in the display area DA. The OLED display includes a plurality of pixel electrodes 160 respectively formed in a plurality of pixels. In some embodiments, the pixel electrodes 160 are spaced apart from each other. FIG. 3 is a drawing illustrating the OLED formed on the first planarization layer 124a of the OLED display shown in FIG. 2.

The pixel electrode 160 is connected to the drain electrode 132 through the electrode via hole 122a.

A pixel defining layer 125 having an opening exposing the pixel electrode 160 is formed on the first planarization layer 124a. That is, the pixel defining layer 125 has a plurality of openings formed in the respective pixels.

An organic emission layer 170 can be formed in each of the openings formed by the pixel defining layer 125. Accordingly, a pixel area in which each organic emission layer is formed can be defined by the pixel defining layer 125.

In some embodiments, the pixel electrode 160 is formed to correspond to the opening of the pixel defining layer 125. However, the pixel electrode 160 is not necessarily formed in only the opening of the pixel defining layer 125, and can be formed beneath the pixel defining layer 125 so that a portion of the pixel electrode 160 overlaps the pixel defining layer 125.

The pixel defining layer 125 can be formed of a polyacrylate resin or a polyimide resin, or silica-based inorganic material.

The above-described organic emission layer 170 is formed on the pixel electrode 160.

The organic emission layer 170 is formed as a plurality of layers including one or more of an emission layer, a hole-injection layer (HIL), a hole-transporting layer (HTL), an electron-transporting layer (ETL), and an electron-injection layer (EIL).

When the organic emission layer 170 includes all of the above-described layers, the hole-injection layer can be positioned on the pixel electrode 160 serving as an anode, and the hole-transporting layer, the emission layer, the electron-transporting layer, and the electron-injection layer can be sequentially laminated on the pixel electrode 160.

The organic emission layer 170 can include a red organic emission layer for emitting red light, a green organic emission layer for emitting green light, and a blue organic emission layer for emitting blue light. The red organic emission layer, the green organic emission layer, and the blue organic emission layer can be respectively formed in red, green, and blue pixels, thereby displaying a color image.

Moreover, the red organic emission layer, green organic emission layer, and blue organic emission layer of the organic emission layer 170 can be respectively laminated on the red, green, and blue pixels, and a red color filter, a green color filter, and a blue color filter can be formed for the respective pixels, thereby displaying a color image.

As another example, a white organic emission layer for emitting white light is formed on all of the red, green, and blue pixels, and a red color filter, a green color filter, and a blue color filter are formed for the respective pixels, thereby displaying a color image. When the white organic emission layer and the color filters are used to display a color image, there is no need to use a deposition mask for depositing the red, green, and blue organic emission layers on the respective pixels, i.e., the red, green, and blue pixels.

The white organic emission layer can be formed as one organic emission layer or a plurality of organic emission layers that are laminated to emit white light. For example, at least one yellow organic emission layer and at least one blue organic emission layer are combined to emit white light, at least one cyan organic emission layer and at least one red organic emission layer are combined to emit white light, or at least one magenta organic emission layer and at least one green organic emission layer are combined to emit white light.

A second electrode, i.e., a common electrode 180, can be formed over the organic emission layer 170. As such, an OLED including the pixel electrode 160, the organic emission layer 170, and the common electrode 180 is formed In some embodiments, each of the pixel electrode 160 and the common electrode 180 is formed of a transparent conductive material or a transflective or reflective conductive material. For example, the pixel electrode 160 and the common electrode 180 are formed of a transparent conductive material such as indium tin oxide (ITO), indium zinc oxide (IZO), zinc oxide (ZnO), or indium oxide (In$_2$O$_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

The OLED display can be a top emission type, a bottom emission type, or a dual surface emission type, according to the kind of materials forming the pixel electrode 160 and the common electrode 180.

An overcoat 190 that protects the common electrode 180 by covering the same can be formed as an organic layer on the common electrode 180.

In addition, a thin film encapsulation layer 141 is formed on the overcoat 190. The thin film encapsulation layer 141 protects the OLED and a driving circuit portion formed on the substrate 123 by sealing them from the external environment.

The thin film encapsulation layer 141 includes organic encapsulation layers 141a and 141c and inorganic encapsulation layers 141b and 141d, which are alternately laminated. In FIG. 2, for example, two organic encapsulation layers 141a and 141c and two inorganic encapsulation layers 141b and 141d are alternately laminated to form the thin film encapsulation layer 141, but the described technology is not limited thereto. Instead of the thin film encapsulation layer, an encapsulation substrate can be formed according to the kind of OLED display.

Hereinafter, an OLED display according to a second exemplary embodiment will be described with reference to FIG. 4. In the OLED display according to the second exemplary embodiment, detailed descriptions of components identical or similar to those of the OLED display according to the first exemplary embodiment will be omitted.

Figure 4:
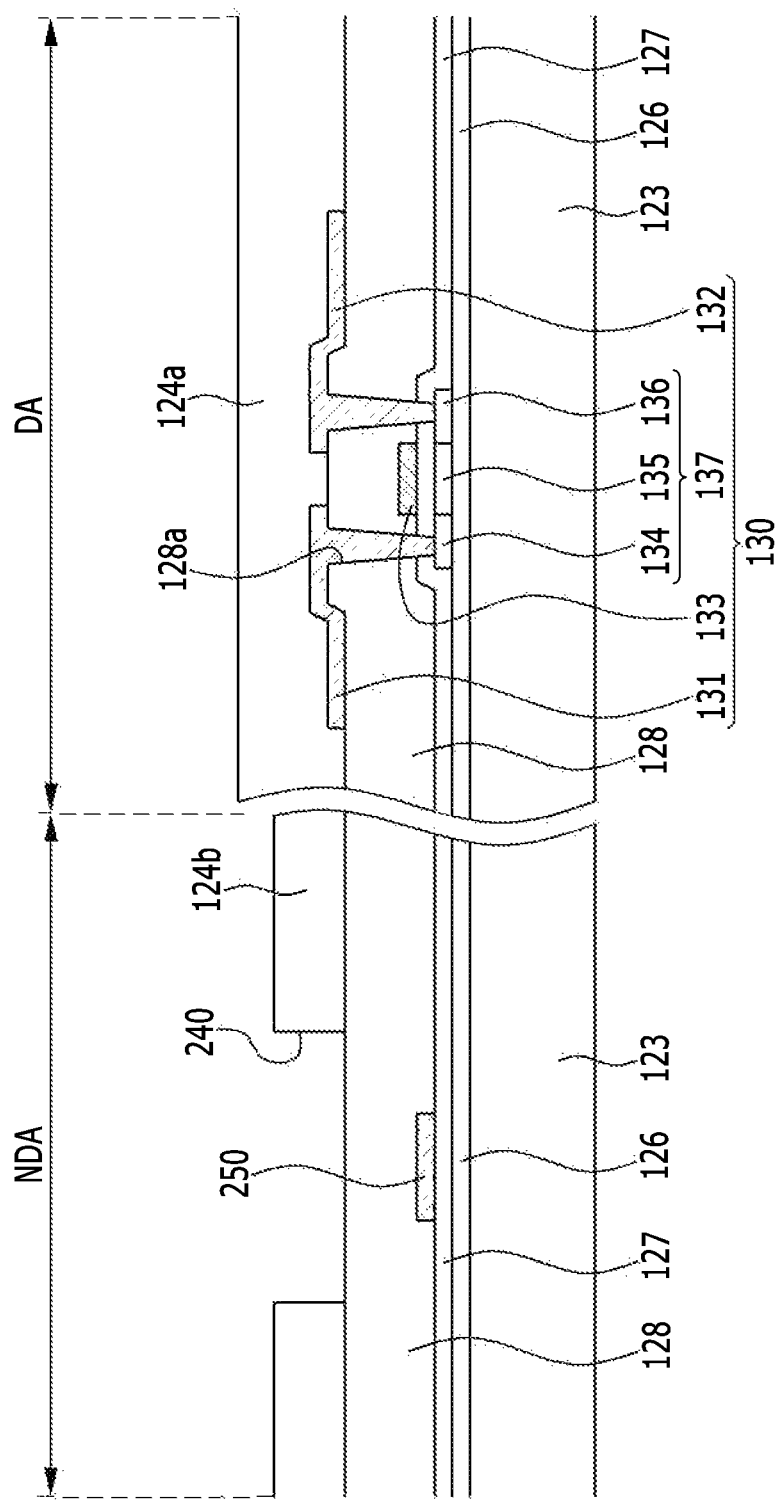
FIG. 4 is a schematic cross-sectional view showing an OLED display according to a second exemplary embodiment.

FIG. 4 is a schematic cross-sectional view showing an OLED display according to a second exemplary embodiment.

Referring to FIG. 4, in the OLED display according to the second exemplary embodiment an exposure hole 240 exposing a top of an interlayer insulating layer 128 covering alignment marks 250 is formed in a second planarization layer 124b.

The alignment marks 250 can be formed on a gate insulating layer 127. The alignment marks 250 can be used to align masks in a process of manufacturing a display device as described above. In some embodiments, the alignment marks 250 are formed on the same layer as a driving gate electrode 133 formed in a display area DA. That is, the alignment marks 250 can be formed of the same material as the driving gate electrode 133.

The interlayer insulating layer 128 covering the alignment marks 250 is formed on the gate insulating layer 127.

The second planarization layer 124b is formed on the interlayer insulating layer 128. According to the second exemplary embodiment, the exposure hole 240 is formed in the second planarization layer 124b. The exposure hole 240 exposes a portion of the interlayer insulating layer 128 located over the alignment marks 250.

As described above, residual gas can be generated in the planarization layer formed as an organic layer. The residual gas can be discharged to the outside through the exposure hole 240.

In the first exemplary embodiment, the residual gas is effectively discharged by reducing the thickness of the planarization layer in the peripheral area, in which the out-gassing hole is formed. However, in the second exemplary embodiment, the residual gas can be discharged through the exposure hole 240 exposing the interlayer insulating layer 128 located over the alignment marks 250.

Hereinafter, a method of manufacturing an OLED display according to an exemplary embodiment will be described. In the method, detailed descriptions of components identical to those of the above-described OLED display will be omitted.

Figure 5:
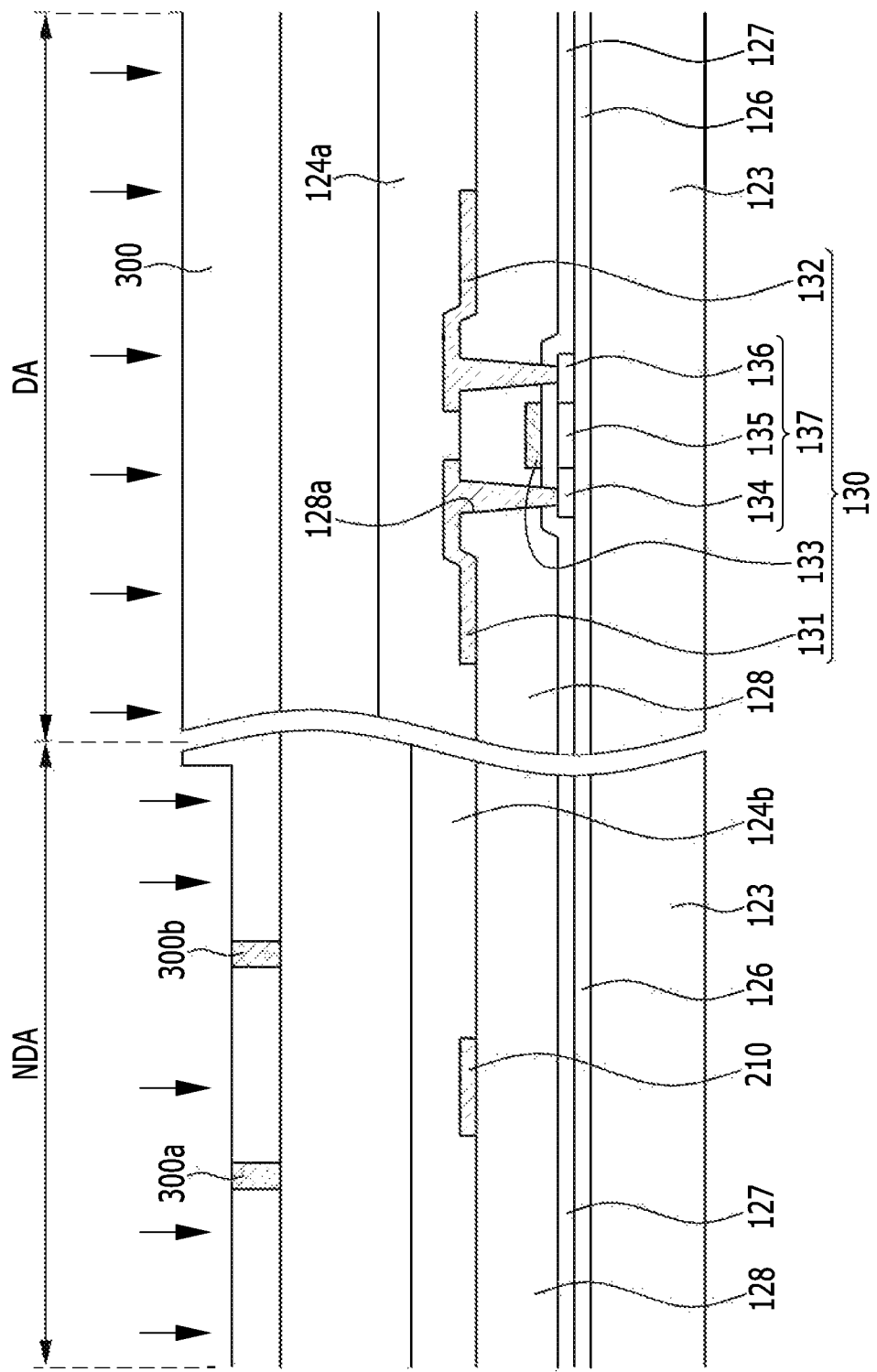
FIG. 5 is a drawing showing a process of manufacturing the OLED display according to the first exemplary embodiment.

FIG. 5 is a drawing showing a process of manufacturing the OLED display according to the first exemplary embodiment of the described technology.

First, a thin film transistor (TFT) is formed in a display area DA on a substrate 123. The thin film transistor includes a driving semiconductor layer 137, a driving gate electrode 133, a driving source electrode 131, and a driving drain electrode 132.

As described above, the driving semiconductor layer 137 is formed on a buffer layer 126, and includes a channel region 135 and source and drain regions 134 and 136 that are respectively formed at both sides of the channel region 135. A gate insulating layer 127 formed of a silicon nitride (SiNx) or a silicon oxide (SiOx) is formed over the driving semiconductor layer 137.

A gate line including the driving gate electrode 133 is formed on the gate insulating layer 127. The driving gate electrode 133 is formed to overlap at least a portion of the driving semiconductor layer 137, particularly the channel region 135.

An interlayer insulating layer 128 covering the driving gate electrode 133 is formed on the gate insulating layer 127. Contact holes 128a respectively exposing the source and drain regions 134 and 136 are formed in the gate insulating layer 127 and the interlayer insulating layer 128.

Like the gate insulating layer 127, the interlayer insulating layer 128 can be formed of a ceramic-based material such as a silicon nitride (SiNx) or a silicon oxide (SiOx).

A data line including a driving source electrode 131 and a driving drain electrode 132 is formed on the interlayer insulating layer 128. The driving source electrode 131 and the driving drain electrode 132 are respectively connected to the source region 134 and the drain region 136 through the contact holes 128a formed in the interlayer insulating layer 128 and the gate insulating layer 127.

In a peripheral area (NDA) of the substrate 123, a plurality of wires and alignment marks 210 are formed on the interlayer insulating layer 128. The wires 210 can be signal lines extending from the display area DA, and the alignment marks 210 can be marks used to align masks in a process of manufacturing a display device. In some embodiments, the wires and alignment marks 210 are formed together with the data line in the display area DA on the substrate 123. That is, the wires and alignment marks 210 can be formed of the same material as the data line.

Then, first and second planarization layers 124a and 124b are formed to cover the driving source electrode 131, the driving drain electrode 132, and the wires and alignment marks 210. As described above, the first planarization layer 124a can be formed in the display area DA, and the second planarization layer 124b can be formed in the peripheral area NDA.

As shown in FIG. 5, a photolithography process using a halftone mask 300 is performed on the first and second planarization layers 124a and 124b. By using the halftone mask 300, the thicknesses of the first and second planarization layers 124a and 124b can be formed differently from each other.

In some embodiments, the above-described out-gassing holes formed in the second planarization layer 124b are formed by specific patterns 300a and 300b formed in the halftone mask 300. According to an exemplary embodiment of the described technology, the thickness T2 of the second planarization layer 124b in a region where out-gassing holes 230a and 230b are formed can be less than the thickness T1 of the first planarization layer 124a in the display area DA. In some embodiments, the region in which the out-gassing holes 230a and 230b are formed represents a region in which the width W between the out-gassing holes 230a and 230b is formed in a constant range. Here, the width W between the out-gassing holes 230a and 230b can have a range of about 400 µm to about 700 µm. However, depending on embodiments, width W can be less than about 400 µm or greater than about 700 µm.

When adjacent out-gassing holes 230a and 230b exist in the range of the width W, the amount of residual gas in the second planarization layer 124b in the region where the out-gassing holes are formed increases as compared with those in other regions. The residual gas degrades an organic emission layer, which can result in a pixel contraction phenomenon. Thus, in order to prevent the organic emission layer from being degraded by the residual gas, the thickness T2 of the second planarization layer 124b in the region is formed less than the thickness T1 of the first planarization layer 124a.

In some embodiments, the thickness T2 of the second planarization layer 124b is less than about 5 µm. The thickness T1 of the first planarization layer 124a can be in the range of about 6 µm to about 8 µm. However, depending on the embodiments, the thickness T2 can be greater than about 5 µm and the thickness T1 can be less than about 6 µm or greater than about 8 µm.

In some embodiments, the wires or alignment marks 210 are formed between the out-gassing holes. That is, the wires or alignment marks 210 can be formed between adjacent out-gassing holes 230a and 230b.

According to at least one of the disclosed embodiments, when adjacent out-gassing holes 230a and 230b exist in the range of the width W, the amount of residual gas in the second planarization layer 124b in the region where the out-gassing holes are formed increases as compared with those in other regions. The residual gas degrades an organic emission layer, which can result in a pixel contraction phenomenon. Thus, in order to prevent the organic emission layer from being degraded by the residual gas, the thickness T2 of the second planarization layer 124b in the region is formed less than the thickness T1 of the first planarization layer 124a.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light-emitting diode (OLED) display, comprising:
   a substrate comprising a display area configured to display an image and a peripheral area surrounding the display area;
   a thin film transistor (TFT) formed in the display area over the substrate;
   a first planarization layer covering the TFT in the display area;
   an OLED formed over the first planarization layer and electrically connected to the TFT; and
   a second planarization layer formed in the peripheral area, wherein the second planarization layer includes a plurality of out-gassing holes formed therein,
   wherein at least a portion of the second planarization layer is thinner than the first planarization layer, and
   wherein the out-gassing holes are configured to discharge a residual gas from the second planarization layer, and no layer is disposed on the out-gassing holes.

2. The OLED display of claim 1, wherein the plurality of out-gassing holes are formed in the portion of the second planarization layer.

3. The OLED display of claim 2, wherein the width between a pair of adjacent ones of the out-gassing holes is in the range of about 400 µm to about 700 µm.

4. The OLED display of claim 3, further comprising a plurality of wires formed in the peripheral area over the substrate, wherein the second planarization layer covers the wires, and
   wherein at least one of the wires is positioned between the pair of adjacent out-gassing holes.

5. The OLED display of claim 4, wherein the TFT comprises:
   an active layer formed over the substrate;
   a gate electrode formed over the active layer; and
   source and drain electrodes formed over the gate electrode and electrically connected to the active layer,
   wherein the first planarization layer covers the source and drain electrodes, and wherein the source and drain electrodes are formed on the same layer as the wires.

6. The OLED display of claim 5, wherein the OLED comprises:
   a first electrode formed over the first planarization layer and electrically connected to the drain electrode;
   a pixel defining layer formed over the first electrode so as to define a pixel area;
   an organic emission layer formed over the first electrode and contacting the first electrode in the pixel area; and
   a second electrode formed over the organic emission layer.

7. The OLED display of claim 3, further comprising an alignment mark formed in the peripheral area, wherein the alignment mark is covered by the second planarization layer, and
   wherein the alignment mark is positioned between the pair of adjacent out-gassing holes.

8. The OLED display of claim 3, wherein the width between the pair is greater than the thickness of the second planarization layer and the thickness of the first planarization layer.

9. The OLED display of claim 3, wherein the width between the pair is greater than the widths of the out-gassing holes.

10. The OLED display of claim 1, wherein the thickness of the second planarization layer is less than about 5 μm.

11. The OLED display of claim 10, wherein the thickness of the first planarization layer is in the range of about 6 μm to about 8 μm.

12. The OLED display of claim 1, wherein the first and second planarization layers are formed on the same layer.

13. An organic light-emitting diode (OLED) display, comprising:

a substrate comprising a display area configured to display an image and a peripheral area surrounding the display area;

an active layer formed in the display area;

a gate electrode formed over the active layer;

an interlayer insulating layer formed over the gate electrode;

source and drain electrodes formed over the interlayer insulating layer and electrically connected to the active layer;

a first planarization layer covering the source and drain electrodes in the display area;

an OLED formed over the first planarization layer and electrically connected to the drain electrode;

an alignment mark covered by the interlayer insulating layer in the peripheral area and configured to align masks during a manufacturing process of the OLED display; and a second planarization layer formed over the interlayer insulating layer in the peripheral area, wherein an exposure hole is formed in the second planarization layer so as to expose the interlayer insulating layer formed over the alignment mark, wherein the exposure hole is configured to discharge a residual gas from the second planarization layer, wherein the alignment mark is not connected to a separate signal line, and wherein no layer is disposed on the exposure hole.

14. The OLED display of claim 13, wherein the alignment mark is formed on the same layer as the gate electrode.

* * * * *